United States Patent
Birner et al.

(10) Patent No.: US 7,144,770 B2
(45) Date of Patent: Dec. 5, 2006

(54) MEMORY CELL AND METHOD FOR FABRICATING IT

(75) Inventors: Albert Birner, Dresden (DE); Matthias Foerster, Dresden (DE); Thomas Hecht, Dresden (DE); Michael Stadtmueller, Dresden (DE); Andreas Orth, Dresden (DE)

(73) Assignee: Infineon Technologies AG, Munich (DE)

( * ) Notice: Subject to any disclaimer, the term of this patent is extended or adjusted under 35 U.S.C. 154(b) by 224 days.

(21) Appl. No.: 10/980,069

(22) Filed: Nov. 3, 2004

(65) Prior Publication Data

US 2005/0158945 A1    Jul. 21, 2005

(30) Foreign Application Priority Data

Jan. 15, 2004 (DE) ............... 10 2004 002 242

(51) Int. Cl.
  *H01L 21/8242* (2006.01)
(52) U.S. Cl. ............. 438/243; 438/244; 438/245; 438/246; 257/E21.651
(58) Field of Classification Search .......... 438/243, 438/246, 244, 245
  See application file for complete search history.

(56) References Cited

U.S. PATENT DOCUMENTS 6,027,967 A * 2/2000 Parekh et al. ............ 438/254

6,297,088 B1 * 10/2001 King ..................... 438/243

FOREIGN PATENT DOCUMENTS

| DE | 10234 735 A1 | 2/2004 |
| EP | 0980 100 A2 | 8/1999 |
| WO | WO 2004/017394 A1 | 2/2004 |

OTHER PUBLICATIONS

German Office Action dated Aug. 27, 2004.

* cited by examiner

*Primary Examiner*—Asok K. Sarkar
*Assistant Examiner*—Victor V. Yevsikov
(74) *Attorney, Agent, or Firm*—Jenkins, Wilson, Taylor & Hunt, P.A.

(57) ABSTRACT

The invention provides a method for fabricating a memory cell, a substrate (101) being provided, a trench-type depression (102) being etched into the substrate (101), a barrier layer (103) being deposited non-conformally in the trench-type depression (102), grain elements (104) being grown on the inner areas of the trench-type depression (102), a dielectric layer (202) being deposited on the surfaces of the grain elements and the inner areas of the trench-type depression, and a conduction layer being deposited on the dielectric layer, the grain elements (104) growing selectively on the inner areas (105) of the trench-type depression (102) in an electrode region (301) forming a lower region of the trench-type depression (102) and an amorphous silicon layer continuing to grow in a collar region (302) forming an upper region of the trench-type depression (102).

22 Claims, 7 Drawing Sheets

MEMORY CELL AND METHOD FOR FABRICATING IT

TECHNICAL FIELD

The present invention relates generally to a method for influencing grain sizes of grain elements which grow on different layer materials, in particular a method for influencing grain sizes of grain elements which are used in memory cells for increasing a capacitance of the memory cells, and relates specifically to a method for fabricating a memory cell, in which a substrate is provided, a trench-type depression is etched into the substrate, a barrier layer is deposited in the trench-type depression of the substrate in a non-conformal manner in such a way that the barrier layer covers an inner area of the trench-type depression only in a collar region forming an upper region of the trench-type depression, grain elements are grown on the inner areas of the trench-type depression, the surfaces of the grain elements together with the inner areas of the trench-type depression forming areas of a first electrode of the memory cell, a dielectric layer is deposited on the surfaces of the grain elements and the inner areas of the trench-type depression, and a conduction layer is deposited on the dielectric layer, the conduction layer forming a second electrode of the memory cell.

BACKGROUND ART

Trench-type depressions (or deep trenches) are preferably used in the fabrication of memory cells. Since a charge that can be stored in a memory cell is proportional to the capacitance of the memory cell, there is a great deal of interest, particularly against the background of increasing miniaturization of microelectronic circuits, in keeping a capacitance of memory cells above a critical value even in the context of increasing miniaturization.

In semiconductor technology, patterning is effected by a combination of lithography with suitable etching methods. However, producing no longer only planar areas but also areas that are at an angle with respect to a reference area (the angle ranges through to 90° and beyond) gives rise to problems which can prevent patterning of such angled areas with lithography.

In order to solve this problem, the prior art has proposed methods which can be used for patterning in the vertical direction.

With regard to fabricating memory cells on the basis of providing trench-type depressions, it has been possible to deposit specific layer types such as, for example, an oxide only in a lower region of a trench, i.e. an electrode region, or only in an upper region of a trench, i.e. in a collar region.

By way of example, in a lower region of a trench-type depression processes have been carried out which relate inter alia to whole-area deposition of an oxide, filling of the structure with a suitable filling material, partial etching-back of the filling material, removal of an uncovered oxide and complete removal of the filling material.

In an upper region of a trench-type depression, the following have been realized: whole-area deposition of an etching stop layer, for example of a nitride layer, filling of a structure with a suitable filling material, for example polysilicon, partial etching-back of a filling material, removal of an uncovered nitride in an uncovered region, deposition or thermal generation of an oxide in an uncovered region, anisotropic etching-up of an oxide, removal of a filling material and removal of an etching stop layer. When suitable filling materials are used, it is possible to carry out the procedure described above without an etching stop layer.

With respect to such a depth patterning, it is furthermore possible, according to the prior art, to use an ALD (Atomic Layer Deposition) process for depth patterning. ALD processes are characterized in that at least two precursors are alternately admitted into a reaction chamber, a layer of defined thickness being deposited in a self-limiting manner in such a cycle. In this case, the deposition in vertical structures during a cycle is effected in a directional manner, beginning at the surface of the substrate. By limiting the precursor quantity supplied, it is thus possible to achieve a deposition only in an upper trench region of the structure. Typically, e.g. $Al_2O_3$ may be deposited in this way.

In a conventional manner, a deposition in a trench-type depression which does not take place uniformly in an upper region (a collar region) and a lower region of the trench-type depression is referred to as a "non-conformal" deposition. By means of such a non-conformal deposition, different materials can be deposited in the collar region produced by this deposition in comparison with the deeper regions.

In order to increase an electrode surface of capacitors that form a memory cell, grain elements are usually grown in the interior of a trench-type depression. With the use of different materials in the lower trench region and in the collar region, the grain elements produced in these regions may differ in form and size. Thus, by way of example, large grain elements are provided when using aluminum oxide ($Al_2O_3$) in the collar region in the case of a process of this type, while a grain size is reduced in a lower region of the trench-type depression.

A memory cell structure produced in accordance with a method according to the prior art is shown in FIG. 7. While the grain elements $K_i$ formed in the lower region of the trench-type depression form an almost regular structure on the sidewalls of the trench-type depression, there is the risk that, on account of the increased grain size in the upper region of the trench-type depression, such large grain elements K2 will arise that the grain elements K2 will grow together, for example at a location identified by a reference symbol Z.

A principal disadvantage of methods according to the prior art is that the fabrication of a memory cell is made considerably more difficult by grains K2 growing together in such a way in the upper region of the trench-type depression.

Usually, a trench-type depression is etched into a silicon material (Si), a protective layer (pad nitride) being provided at the surface of the silicon wafer.

SUMMARY OF THE INVENTION

Therefore, it is an object of the present invention to specify a method for fabricating a memory cell and a memory cell which provide an improved structure of the grain elements enlarging an electrode surface.

This object is achieved according to the invention by means of a method for fabricating a memory cell specified in Patent Claim 1.

Furthermore, the object is achieved by means of a memory cell having the features of Patent Claim 12.

Further refinements of the invention emerge from the subclaims.

An essential concept of the invention consists in influencing a growth of grain elements at the inner walls of a trench-type structure of a memory cell in such a way that grain elements grow selectively only on the inner areas of the trench-type depression in an electrode region, i.e. in a lower region of the trench-type depression, only an amorphous silicon layer continuing to grow in an upper region, i.e. a collar region of the trench-type depression. Different surfaces are present in the two regions.

Consequently, it is an essential advantage of the present invention that it is possible to provide memory cell structures with an increased storage capacitance without an upper region of a trench-type structure growing over due to formation of grain elements. Furthermore, the resulting structure is advantageous for integration since an $Al_2O_3$ layer provided in an upper region of the trench structure is stressed uniformly during removal of a silicon in an upper region, but during an etching-back of grain elements that arise in the upper region according to the prior art, the regions that are not covered by grain elements are etched to a greater extent.

Consequently, the heart of the invention consists in depositing an amorphous silicon layer on the inner areas of the trench-type depression in such a way that the amorphous silicon layer is closed in the collar region, while the amorphous silicon layer does not form a closed structure in an electrode region forming the lower region of the trench-type depression, and in growing grain elements selectively on the inner areas of the trench-type depression in the electrode region, the amorphous silicon layer continuing to grow in the collar region of the trench-type depression.

In an advantageous manner, such a two-stage deposition can be realized in a single furnace process.

The method according to the invention for fabricating a memory cell essentially has the following steps:

a) providing a substrate, b) patterning the substrate (101);

c) non-conformally depositing a barrier layer in the trench-type depression of the substrate in such a way that the barrier layer covers an inner area of the trench-type depression only in a collar region forming an upper region of the trench-type depression;

d) growing grain elements on the inner areas of the trench-type depression, the surfaces of the grain elements together with the inner areas of the trench-type depression forming areas of a first electrode of the memory cell and deposited material being removed in the collar region;

e) depositing a dielectric layer on the surfaces of the grain elements and the inner areas of the trench-type depression; and f) depositing a conduction layer on the dielectric layer, the conduction layer forming a second electrode of the memory cell;

in which case step d) of growing the grain elements on the inner areas of the trench-type depression comprises the following two-stage step of:

d1) depositing an amorphous silicon layer on the barrier layer on the inner areas of the trench-type depression in such a way that the amorphous silicon layer is closed in the collar region, while the amorphous silicon layer does not form a closed structure in an electrode region forming a lower region of the trench-type depression; and d2) selectively growing the grain elements on the inner areas of the trench-type depression in the electrode region, the amorphous silicon layer continuing to grow in the collar region of the trench-type depression.

Furthermore, the memory cell according to the invention for storing electrical charge essentially has:

a) a substrate having a trench-type depression with a collar region forming an upper region of the trench-type depression and an electrode region forming a lower region of the trench-type depression;

b) grain elements on the inner areas of the trench-type depression, the surfaces of the grain elements together with the inner areas of the trench-type depression providing areas of a first electrode of the memory cell;

c) a dielectric layer deposited on the surfaces of the grain elements and the inner areas of the trench-type depression, said dielectric layer providing a dielectric of the memory device; and f) a conduction layer deposited on the dielectric layer, said conduction layer providing a second electrode of the memory cell;

in which case an amorphous silicon layer is provided on the barrier layer on the inner areas of the trench-type depression in such a way that the amorphous silicon layer is closed in the collar region, while the amorphous silicon layer does not have a closed structure in an electrode region forming a lower region of the trench-type depression, and the grain elements are provided such that they are grown on the inner areas of the trench-type depression selectively in the electrode region, while the amorphous silicon layer that has continued to grow is provided in the collar region of the trench-type depression.

Advantageous developments and improvements of the respective subject matter of the invention are found in the subclaims.

In accordance with one preferred development of the present invention, in the course of patterning the substrate, a trench-type depression is etched into the substrate.

In accordance with another preferred development of the present invention, after non-conformally depositing the barrier layer in the electrode region of the trench-type depression, a sidewall etching is carried out for the purpose of widening the electrode region of the trench-type depression. Such an etching may advantageously be provided by a wet etching process.

In accordance with a further preferred development of the present invention, after growing grain elements on the inner areas of the trench-type depression, a gas phase doping is carried out at the inner areas of the electrode region of the trench-type depression for the purpose of forming a doped first electrode of the memory cell. Preferably, the gas phase doping at the inner areas of the electrode region of the trench-type depression provides a doping $n^+$ of the first electrode in the range of $10^{-19}$ to $10^{-20}$ $cm^{-3}$.

It is expedient if the gas phase doping at the inner areas of the electrode region of the trench-type depression is carried out by means of arsine ($AsH_3$).

A silicon nitride material (SiN) and/or an aluminum oxide material ($Al_2O_3$) is preferably provided in the collar region forming the upper region of the trench-type depression.

It is advantageous that the grain elements grown at the inner areas of the trench-type depression have a grain size in a range of 10 nm to 80 nm (nanometers). It is expedient if a layer made of silicon dioxide ($SiO_2$), preferably with a layer thickness of 0.2 nm to 1.5 nm, is provided prior to growth of the grain elements in the electrode region of the trench-type depression.

In accordance with yet another preferred development of the present invention, the grain elements grown on the inner areas of the trench-type depression are formed as hemispherical silicon grains.

In accordance with yet another preferred development of the present invention, the conduction layer, which is preferably formed as a filling material and is deposited on the dielectric layer, completely fills the trench-type depression. The conduction layer preferably forms the second electrode of the memory cell.

Preferably, the substrate is formed from silicon, preferably from a p-doped silicon material.

Preferably, a silicon nitride material and/or an aluminum oxide material is provided in the upper region, i.e. the collar region of the trench-type depression.

The trench-type depression in the substrate preferably has a structure width in a range of 20 nm to 500 nm (nanometers). Preferably, grain elements grown on the inner areas of the trench-type depression in the electrode region are formed as hemispherical silicon grains.

Exemplary embodiments of the invention are illustrated in the drawings and are explained in more detail in the description below.

DETAILED DESCRIPTION OF THE INVENTION

In the figures, identical reference symbols designate identical or functionally identical components or steps.

Figure 1:
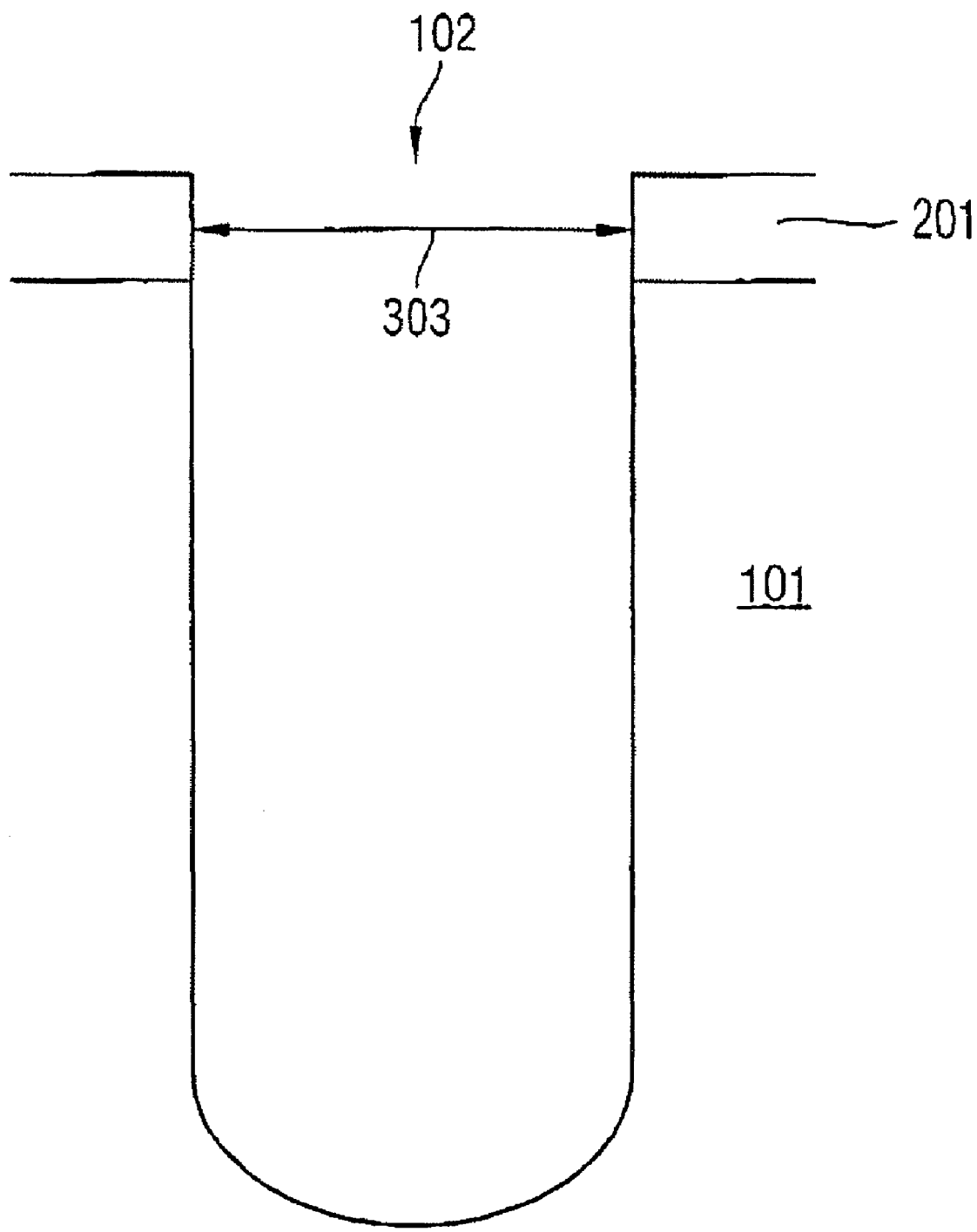
FIG. 1 shows a trench-type depression in a substrate as an initial state of the method according to the invention.

FIG. 1 shows a silicon substrate 101, to which a nitride layer is applied as a protective layer (a pad nitride). Furthermore, a trench-type depression (deep trench) 102 having a width 303 of typically 20 nm to 500 nm is etched into the substrate 101 shown in FIG. 1. The arrangement shown in FIG. 1 forms a basic element for fabricating a memory cell according to the invention.

Figure 2:
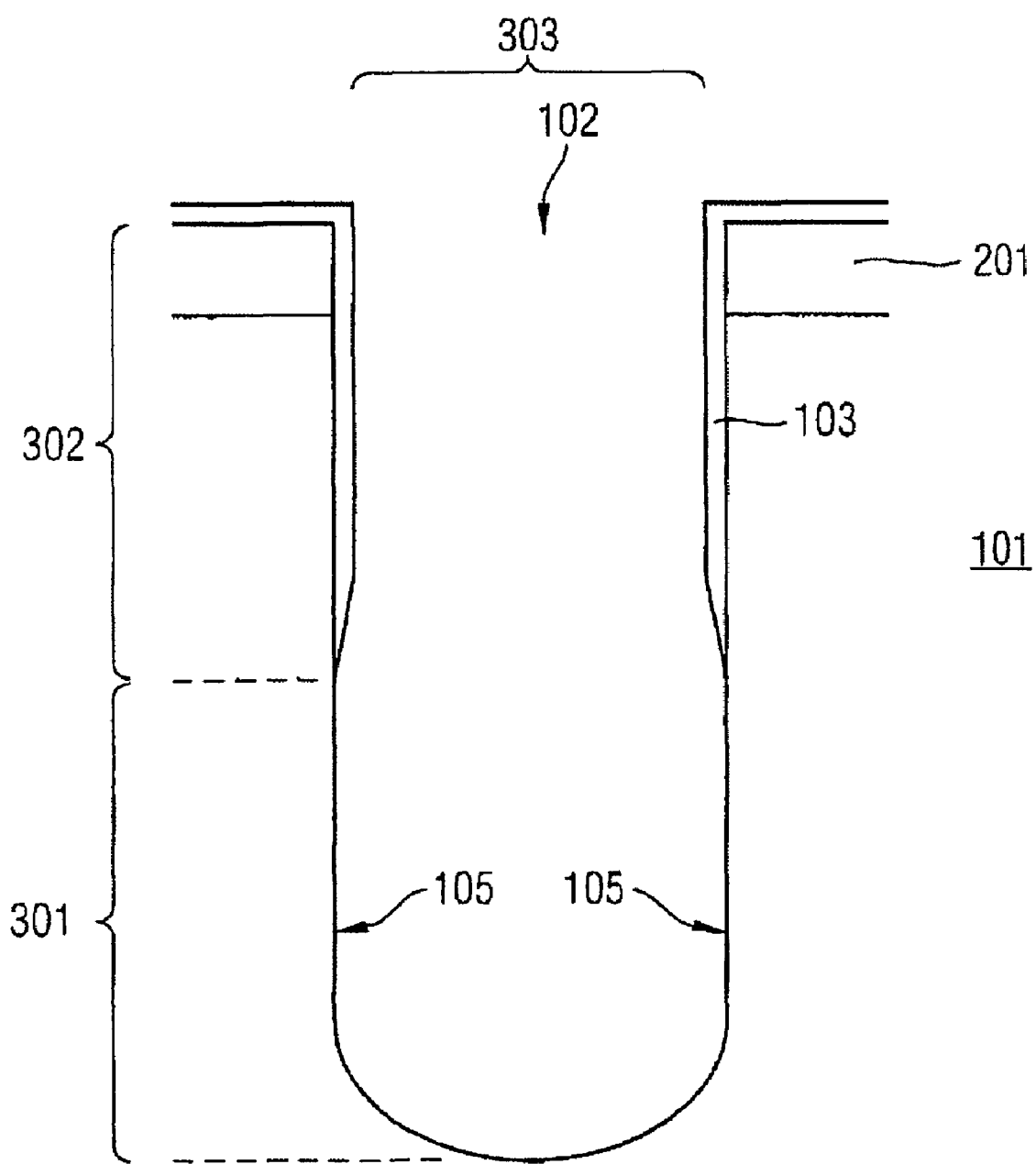
FIG. 2 shows the arrangement shown in FIG. 1 after deposition of a barrier layer in an upper region of the trench-type depression.

FIG. 2 shows the arrangement illustrated in FIG. 1 after deposition of a barrier layer 103 in a collar region 302 forming an upper region of the trench-type depression 102.

It should be pointed out that in FIG. 2 and the subsequent figures, those elements that have already been described in previous figures are not described anew in order to shorten the illustration.

In an electrode region 301 forming a lower region of the trench-type structure 102, inner areas 105 have remained uncoated after the process step shown in FIG. 2. Such a non-conformal deposition of a layer (a liner) by means of an ALCVD process is known to average skilled workers in coating technology.

The barrier layer may be provided for example from a silicon nitride material SiN and/or aluminum oxide material $Al_2O_3$. In the case of a processing of the structure shown in FIG. 2, in accordance with a preferred exemplary embodiment of the present invention, a thin silicon oxide layer $SiO_2$ having a layer thickness of less than 1 nm, for example, is formed in the lower region of the trench-type depression 102, i.e. in the electrode region 301.

Figure 3:
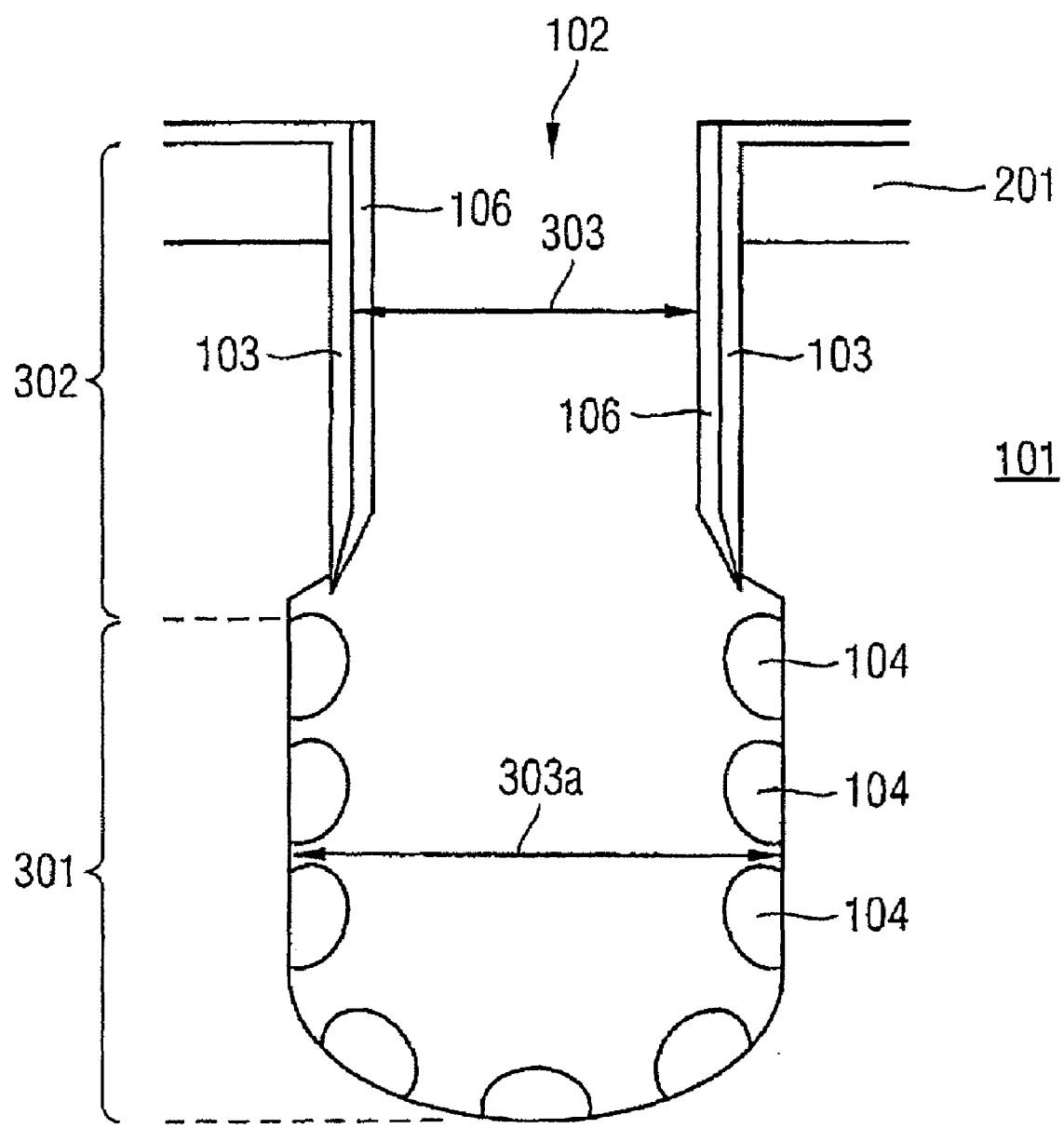
FIG. 3 shows the arrangement shown in FIG. 2 after growth according to the invention of an amorphous silicon layer in the upper region of the trench-type depression and growth of grain elements in a lower region of the trench-type depression.

FIG. 3 shows the growth according to the invention of grain elements 104, which is provided selectively in the electrode region 301 (lower region of the trench-type depression 102). In this case, it is essential that the inner walls of the trench-type depression 102 have different properties in the upper region, i.e. the collar region 302, and the lower region, i.e. the electrode region 301.

It should be pointed out that a sidewall etching by means of a wet-chemical process may be performed prior to application of the grain elements 104 for the purpose of further increasing the surface area of a first electrode of the memory cell. This state is illustrated in FIG. 3 by means of an electrode region width 303a that differs from the collar region width 303.

During the deposition of grain elements or hemispherical grains (HSG=Hemispherical Silicon Grains), grain elements of different sizes arise, then, depending on the material of the sidewall on which the grain elements are deposited. Investigations have shown that growth of grain elements on SiN or $Al_2O_3$ proceeds differently from grain growth on $SiO_2$, in such a way that larger grains grow on SiN or $Al_2O_3$ than on $SiO_2$.

Since a thin $SiO_2$ layer of chemical origin is normally used as an interface for a deposition of grain elements but with the use of customary fabrication methods for memory cells (NOLA concept), an $Al_2O_3$ material is present in the upper region of the trench-type depression, i.e. in the collar region, in the case of conventional methods grain elements formed in the collar region 302 are always larger than in the electrode region 301.

The present invention avoids this disadvantage by virtue of the fact that the process of growing grain elements 104 on the inner areas 105 of the trench-type depression 102 is carried out in two stages in a single furnace process. The method according to the invention utilizes an effect in such a way that a closed layer structure is formed earlier during a deposition of amorphous silicon on $Al_2O_3$ than during a corresponding deposition on $SiO_2$, i.e. provision is made of a time interval in which a closed amorphous silicon layer has already been formed on $Al_2O_3$ while no deposition or only island growth can be ascertained in the underlying electrode region 301 of the trench-type depression 102 on the $SiO_2$ layer.

For technical utilization of this effect, according to the invention, firstly amorphous silicon is deposited, this deposition being interrupted once a closed layer made of amorphous silicon has formed on the $Al_2O_3$ material present in the upper region 302 of the trench-type depression 102 but a closed deposition does not yet exist on the underlying $SiO_2$ material. Afterward, the process conditions (two-stage process) are altered in such a way that there ensues a deposition of grain elements 104, which now grow only in the lower region 301 of the trench-type depression 102, while no or almost no grain elements or HSGs are formed on the closed amorphous silicon layer in the upper region 302, rather a conformal silicon deposition predominantly occurs there.

Consequently, a closed, conformal silicon layer is obtained in the collar region 302, while the desired grain elements 104 grow in the lower electrode region 301. In this way, the disadvantage of methods in accordance with the prior art is avoided in such a way that overgrowth is prevented in the collar region 302. The method according to the invention is composed of a combination of selective growth of grain elements in the electrode region 301 and growth of an amorphous silicon layer in the collar region 302, only a single furnace step advantageously being necessary.

The deposition conditions in the two-stage process are as follows:

(i) A momentary deposition of amorphous silicon for producing a closed layer made of amorphous silicon on $Al_2O_3$ is effected at a temperature of 480 to 520° C., a pressure of 100 mtorr to 100 torr, a deposition time at 500° C. being 0.1 to 20 minutes; silane, disilane and dichlorosilane are precursor materials known to the skilled worker, diluted with $H_2$, $N_2$ or noble gases.

(ii) A deposition of grain elements 104 the conditions chosen leading to no or only a small number of grain elements on the amorphous silicon layer formed in the upper region 302 and the amorphous silicon layer essentially continuing to grow conformally, is effected at a temperature of 520 to 600° C., which is increased in comparison with process step (i), a pressure of 100 mtorr to 100 torr, which is reduced in comparison with the pressure in process step (i), with a deposition time of 1 minute to 3 hours. The gas flows to be used depend on the number of wafers to be processed.

It should furthermore be pointed out that the method according to the invention may also be provided with other materials, for example a silicon nitride material SiN may be provided instead of $Al_2O_3$. Therefore, the method according to the invention is not restricted to fabrication of a memory cell, but rather may be used for any selective application of grain elements on substrates partially covered with $Al_2O_3$, SiN or other materials.

Figure 4:
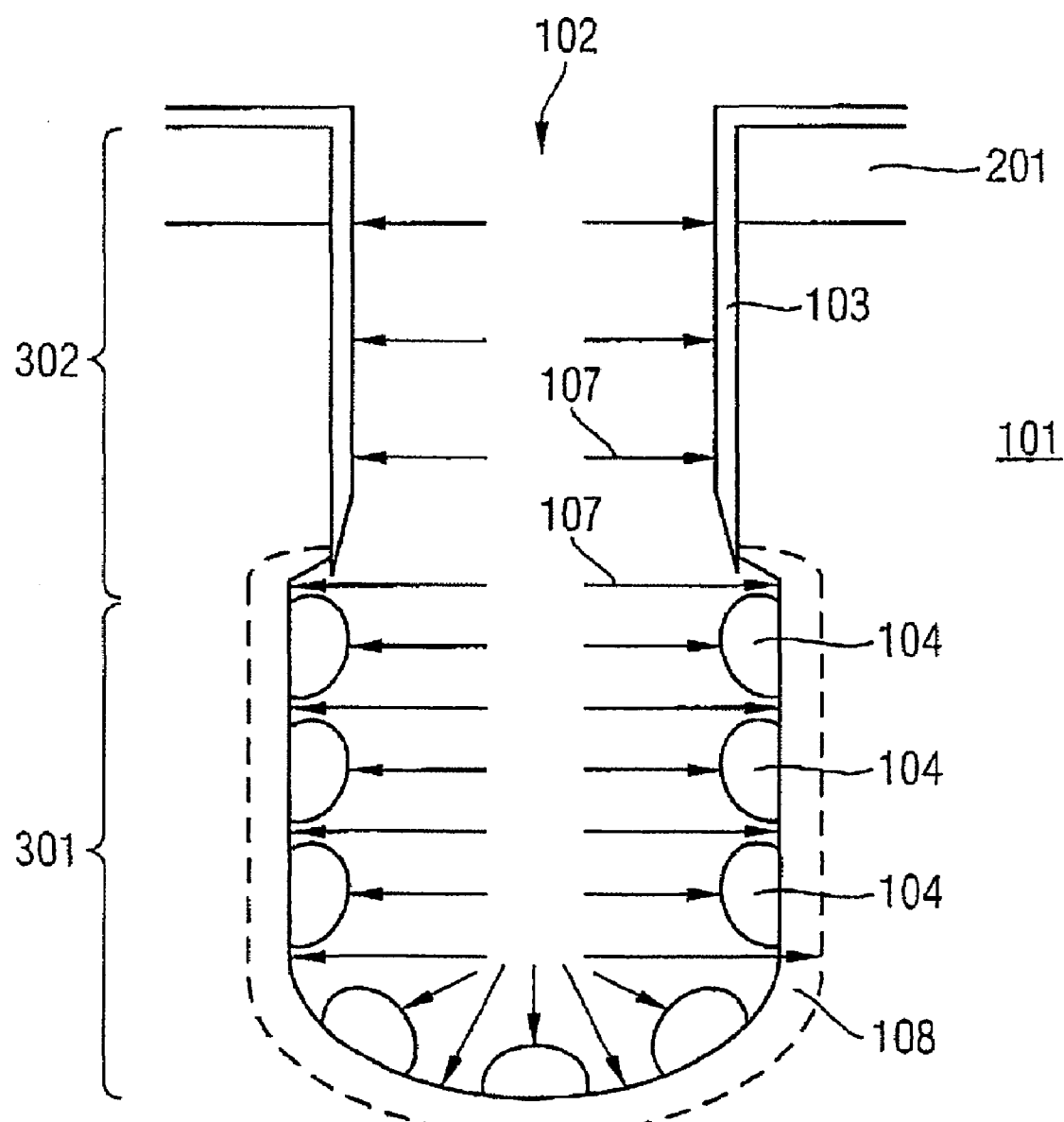
FIG. 4 shows a doping process with regard to the arrangement shown in FIG. 3.
Figure 5:
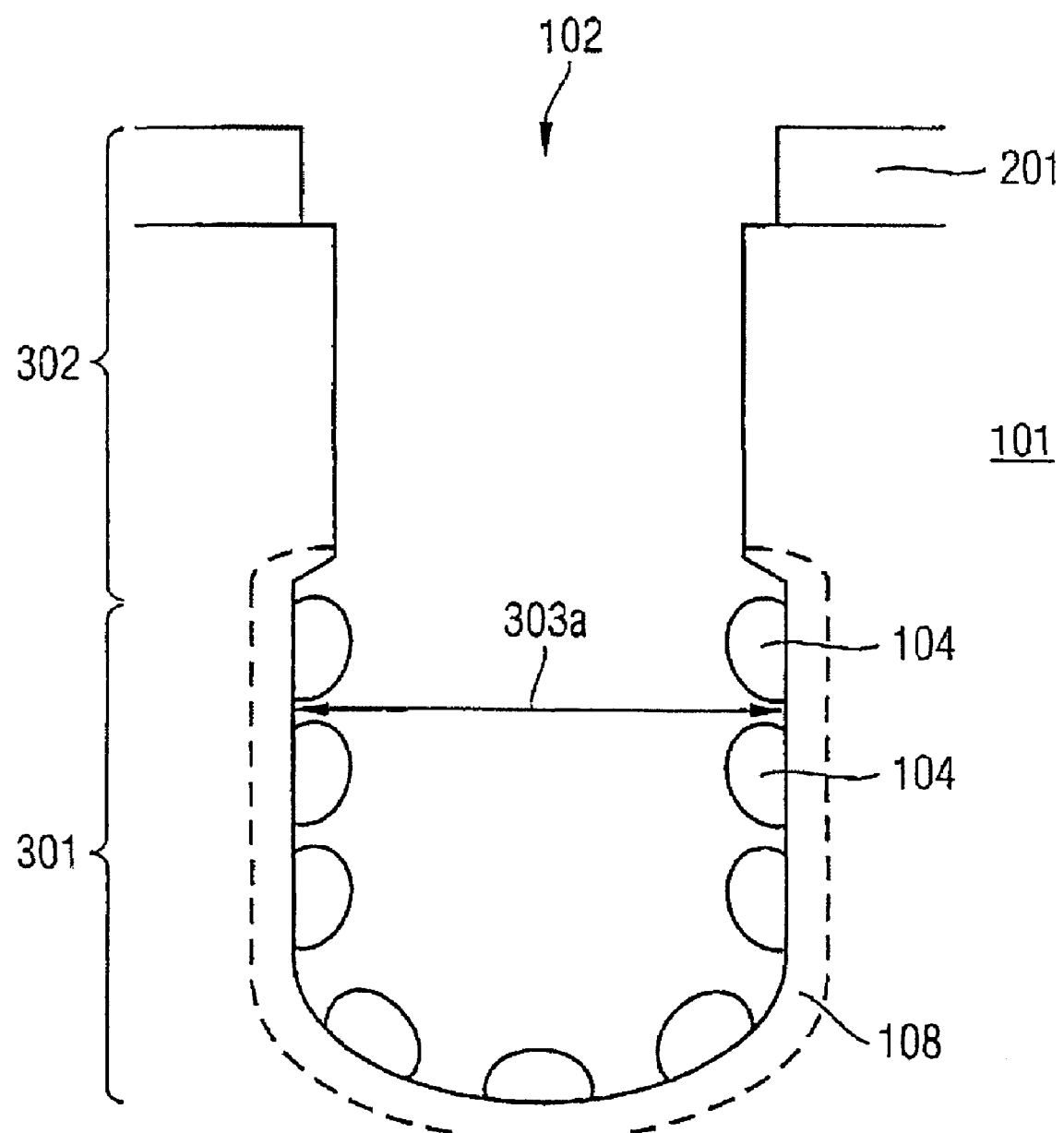
FIG. 5 shows the trench-type depression after removal of the barrier layer in accordance with a preferred exemplary embodiment of the present invention.
Figure 6:
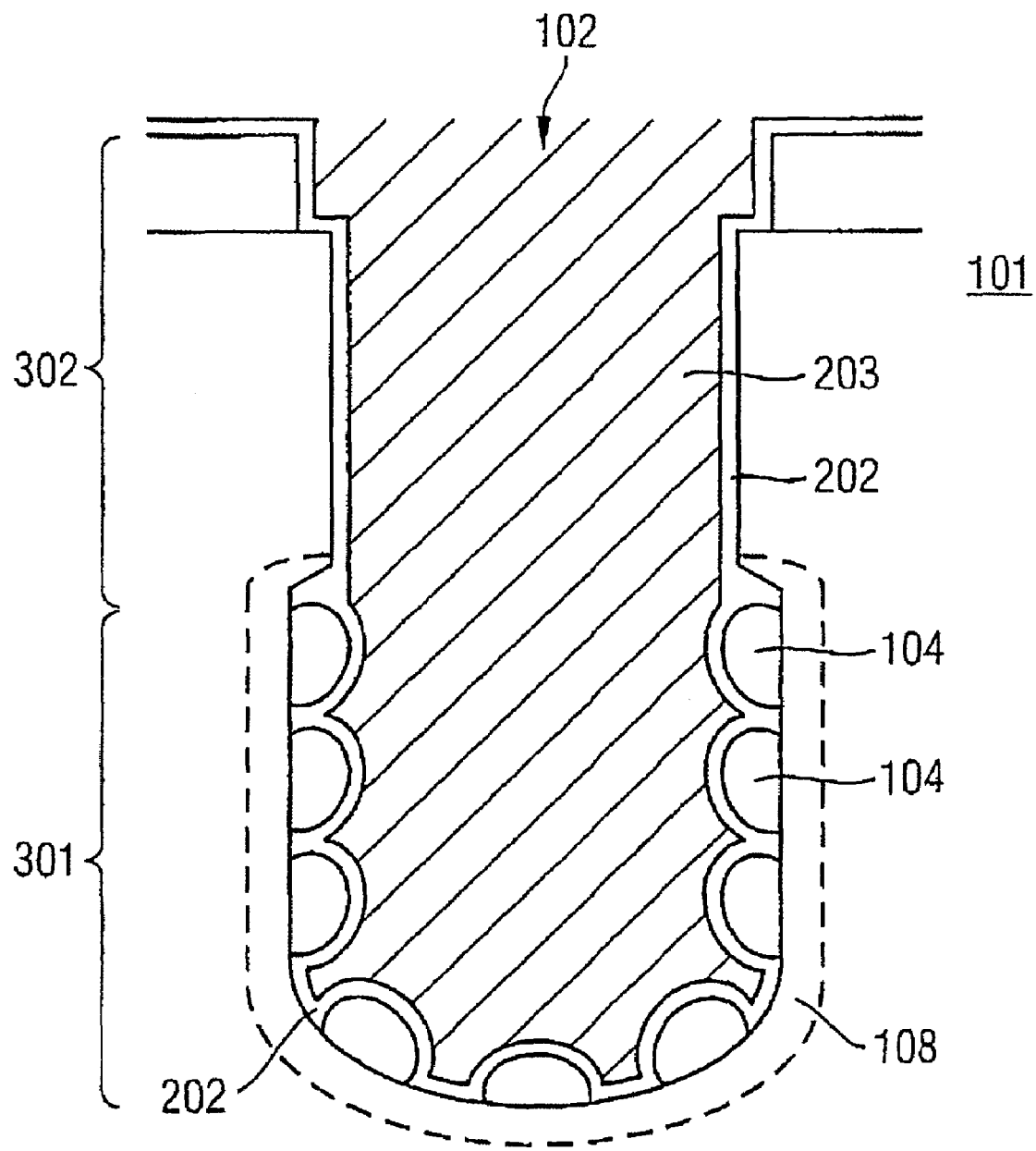
FIG. 6 shows a completely formed memory cell after deposition of a dielectric layer and of a conduction layer onto the arrangement shown in FIG. 5.
Figure 7:
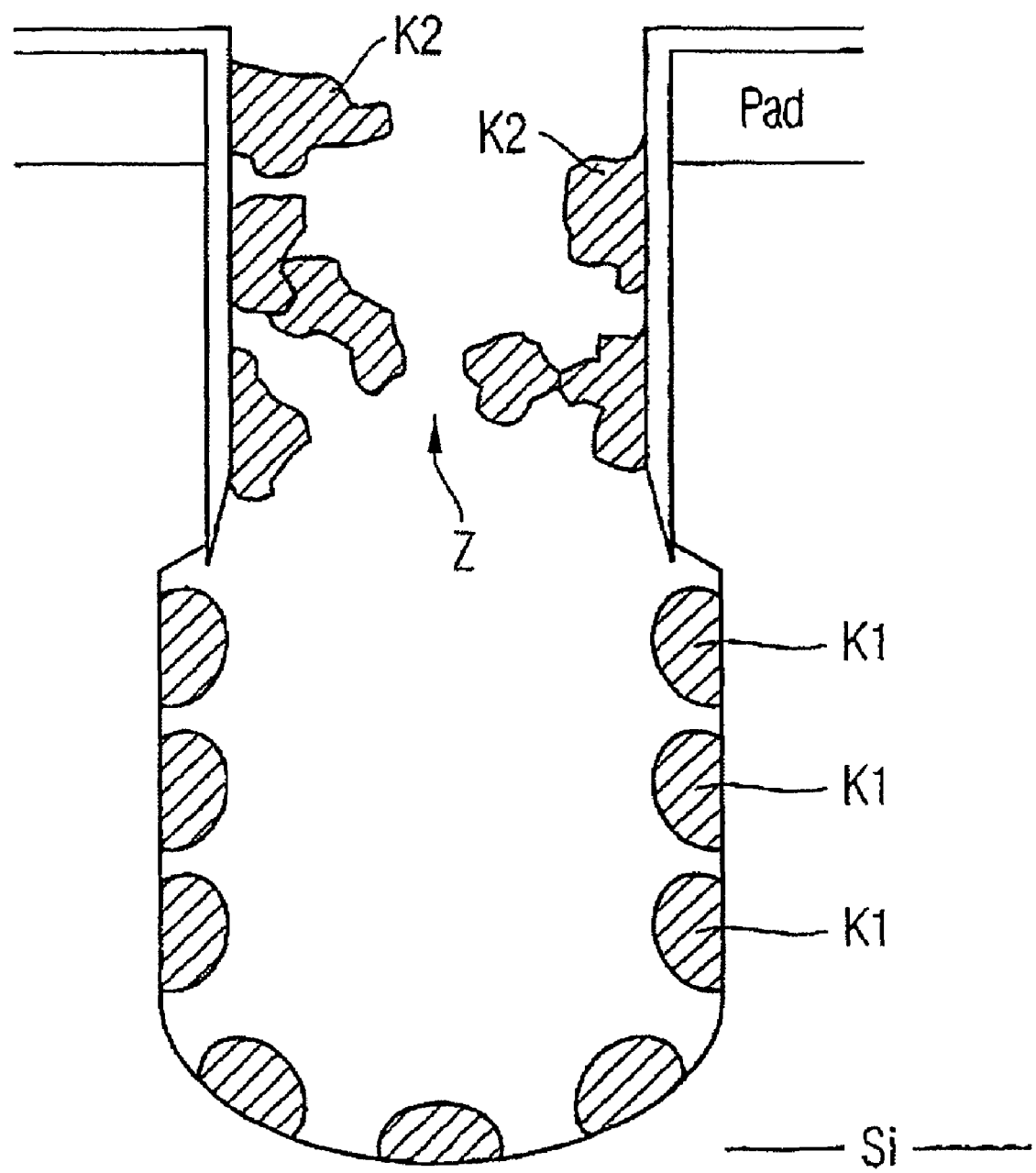
FIG. 7 shows a growth process of grain elements according to a conventional method.

FIGS. 4 to 6 show further process steps for the fabrication of a memory cell according to the invention.

FIG. 4 shows that after a step of growing grain elements 104 on the inner areas 105 of the trench-type depression 102 and removing silicon from the collar region, a gas phase doping is provided at the inner areas 105 in a doping step 107 (indicated by arrows in FIG. 4). Such a doping leads to a "buried plate" in the electrode region 301, a high doping $n^+$ in the range of $10^{-19}$ to $10^{-20}$ $cm^{-3}$ being produced.

In this way, it is possible to provide an n-type doping on a customarily p-doped silicon substrate, such a doping not being effected in the collar region.

FIG. 5 illustrates the arrangement shown in FIG. 4 after an etching-back or a removal of the barrier layer 103 in such a way that the surfaces of the grain elements 104 and the inner area 105 of the trench-type depression are uncovered, so that the surfaces of a first electrode of the memory cell are accessible for further treatment.

FIG. 6 illustrates the last two process steps for fabricating the memory cell according to the invention, which has grain elements 104 for enlarging the surface of the first electrode only in the lower electrode region 301, a doped electrode region 108 furthermore being provided in the lower electrode region 301 by means of a doping carried out in the step in accordance with FIG. 4.

As illustrated in FIG. 6, the surface of the grain elements 104 and the residual inner area 105 of the trench-type depression 102 are provided with a dielectric layer 202 having a dielectric constant suitable for the field of use of the memory cell.

It should be pointed out that the dielectric constant of the dielectric layer 202 is set in such a way that, on the one hand, a high value of the dielectric constant is provided and, on the other hand, an electrical resistance of the dielectric layer and thus the possibility of a voltage breakdown are kept low.

Finally, as a second electrode of the memory cell according to the invention, a conduction layer 203 is deposited on the dielectric layer 202, the conduction layer 203 completely filling the residual internal space of the trench-type depression 102 in the preferred exemplary embodiment of the invention. It is thus possible to store charges in the memory cell by connecting the memory cell to the two electrodes or the nitride layer 201 and the conduction layer 203.

Although the present invention has been described above on the basis of preferred exemplary embodiments, it is not restricted thereto, but rather can be modified in diverse ways.

Moreover, the invention is not restricted to the application possibilities mentioned.

What is claimed is:

1. Method for fabricating a memory cell, having the following steps of:
   a) providing a substrate,
   b) patterning the substrate by etching a trench-type depression into the substrate,
   c) producing a barrier layer in the trench-type depression of the substrate in such a way that the barrier layer covers an inner area of the trench-type depression only in a collar region forming an upper region of the trench-type depression;
   d) growing grain elements on the inner areas of the trench-type depression, the surfaces of the grain elements together with the inner areas of the trench-type depression forming areas of a first electrode of the memory cell and grain elements being etched back in the collar region;
   e) depositing a dielectric layer on the surfaces of the grain elements and the inner areas of the trench-type depression; and
   f) depositing a conduction layer on the dielectric layer, the conduction layer forming a second electrode of the memory cell; wherein step d) of growing the grain elements on the inner areas of the trench-type depression comprises the following two substeps of:
      d1) depositing an amorphous silicon layer on the barrier layer on the inner areas of the trench-type depression in such a way that the amorphous silicon layer is closed in the collar region, while the amorphous silicon layer does not form a closed structure in an electrode region forming a lower region of the trench-type depression; and
      d2) selectively growing the grain elements on the inner areas of the trench-type depression in the electrode region, the amorphous silicon layer continuing to grow in the collar region of the trench-type depression.

2. Method according to claim 1, wherein, in step b), a trench-type depression is etched into the substrate.

3. Method according to claim 1, wherein, after step c) of producing the barrier layer in the electrode region of the trench-type depression, a sidewall etching is carried out for the purpose of widening the electrode region of the trench-type depression.

4. Method according to claim 1 wherein, after step d) of growing grain elements on the inner areas of the trench-type depression, a gas phase doping is carried out at the inner areas of the electrode region of the trench-type depression for the purpose of forming a doped first electrode of the memory cell.

5. Method according to claim 4, wherein the gas phase doping at the inner areas of the electrode region of the trench-type depression provides a doping of the first electrode in the range of $10^{-19}$ to $10^{-20}$ cm$^{-3}$.

6. Method according to claim 5, wherein the gas phase doping at the inner areas of the electrode region of the trench-type depression is carried out by means of arsine.

7. Method according to claim 1, wherein a silicon nitride material and/or an aluminum oxide material is provided in the collar region of the trench-type depression.

8. Method according to claim 1, wherein the grain elements grown on the inner areas of the trench-type depression are grown with a grain size in a range of 10 nm to 80 nm.

9. Method according to claim 1, wherein a layer made of silicon dioxide is produced in the electrode region of the trench-type depression prior to growth of the grain elements.

10. Method according to claim 1, wherein the grain elements grown on the inner areas of the trench-type depression are formed as hemispherical silicon grains.

11. Method according to claim 1, wherein the conduction layer, which is deposited on the dielectric layer and which forms the second electrode of the memory cell, completely fills the trench-type depression.

12. Memory cell for storing electrical charge, having:
   a) a substrate having a trench-type depression with a collar region forming an upper region of the trench-type depression and an electrode region forming a lower region of the trench-type depression;
   b) grain elements on the inner areas of the trench-type depression, the surfaces of the grain elements together with the inner areas of the trench-type depression providing areas of a first electrode of the memory cell;
   c) a dielectric layer deposited on the surfaces of the grain elements and the inner areas of the trench-type depression, said dielectric layer providing a dielectric of the memory device; and
   d) a conduction layer deposited on the dielectric layer, said conduction layer providing a second electrode of the memory cell; characterized in that an amorphous silicon layer is provided on the barrier layer on the inner areas of the trench-type depression in such a way that the amorphous silicon layer is closed in the collar region, while the amorphous silicon layer does not have a closed structure in an electrode region forming a lower region of the trench-type depression, the grain elements being provided such that they are grown on the inner areas of the trench-type depression selectively in the electrode region, while the amorphous silicon layer that has continued to grow is provided in the collar region of the trench-type depression.

13. Memory cell according to claim 12, wherein the substrate is formed from a p-doped silicon material.

14. Memory cell according to claim 12, wherein a silicon nitride material and/or an aluminum oxide material is provided in the collar region of the trench-type depression.

15. Memory cell according to claim 12, wherein the grain elements grown on the inner areas of the trench-type depression in the electrode region have a grain size in a range of 10 nm to 80 nm.

16. Memory cell according to claim 12, wherein the trench-type depression in the substrate has a structure width in a range of 20 nm to 500 nm.

17. Memory cell according to claim 12, wherein grain elements grown on the inner areas of the trench-type depression in the electrode region are formed as hemispherical silicon grains.

18. Method according to claim 1, wherein the barrier layer is produced in the electrode region of the trench-type depression by means of a non-conformal deposition.

19. Method according to claim 1, wherein the barrier layer is produced in the electrode region of the trench-type depression by means of the following steps of:
   a) filling the trench-type depression with a filling material;
   b) removing the filling material in an upper region of the trench-type depression;
   c) depositing the barrier layer;
   d) etching anisotropically the barrier layer; and
   e) removing the residual filling material.

20. Method for selectively fabricating hemispherical grain elements, having the steps of:
   a) providing a substrate;
   b) patterning the substrate;
   c) depositing a barrier layer on the patterned substrate in such a way that both parts of the substrate and parts of the barrier layer are uncovered at the surface; and
   d) depositing a silicon material in such a way that the latter grows on the substrate in the form of hemispherical grain elements, while a homogeneous layer made of the silicon material is formed on the barrier layer.

21. Method according to claim 20, wherein the barrier layer is deposited selectively on the patterned substrate.

22. Method according to claim 20, wherein the barrier layer is deposited over the whole area on the patterned substrate and is subsequently patterned.

* * * * *